US012707811B2

(12) United States Patent
Lee et al.

(10) Patent No.: US 12,707,811 B2
(45) **Date of Patent: *Aug. 11, 2026**

(54) ORGANIC LIGHT EMITTING DISPLAY DEVICE AND METHOD OF MANUFACTURING THE SAME

(71) Applicant: LG Display Co., Ltd., Seoul (KR)

(72) Inventors: Joonsuk Lee, Seoul (KR); Sejune Kim, Paju-si (KR); JeongHyeon Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 428 days.

This patent is subject to a terminal disclaimer.

(21) Appl. No.: 18/483,371

(22) Filed: Oct. 9, 2023

(65) Prior Publication Data

US 2024/0040820 A1 Feb. 1, 2024

Related U.S. Application Data

(63) Continuation of application No. 17/522,042, filed on Nov. 9, 2021, now Pat. No. 11,818,910, which is a (Continued)

(30) Foreign Application Priority Data

Nov. 10, 2015 (KR) ........................ 10-2015-0157090

(51) Int. Cl.
*H10K 59/121* (2023.01)
*H10K 59/122* (2023.01)
(Continued)

(52) U.S. Cl.
CPC ......... *H10K 59/121* (2023.02); *H10K 59/122* (2023.02); *H10K 59/131* (2023.02);
(Continued)

(58) Field of Classification Search
CPC .................................................... H10K 71/861
See application file for complete search history.

(56) References Cited

U.S. PATENT DOCUMENTS 9,147,723 B1 9/2015 Lee et al.
11,201,311 B2 * 12/2021 Lee ........................ H10K 71/70
(Continued)

FOREIGN PATENT DOCUMENTS

CN 104517995 A 4/2015
CN 104659055 A 5/2015
(Continued)

OTHER PUBLICATIONS

United States Office Action, U.S. Appl. No. 15/347,507, filed Aug. 28, 2017, nine pages.
(Continued)

*Primary Examiner* — Bryan R Junge
(74) *Attorney, Agent, or Firm* — Fenwick & West LLP

(57) ABSTRACT

An organic light emitting display device is disclosed, which comprises an anode electrode provided in a light emitting area on a substrate having a plurality of pixels, each pixel including a light emitting area and a transmissive area; an organic light emitting layer on the anode electrode; a cathode electrode on the organic light emitting layer; an auxiliary electrode connected with the cathode electrode; and a connection electrode connected with the anode electrode and provided in the transmissive area of the substrate.

17 Claims, 8 Drawing Sheets

Related U.S. Application Data continuation of application No. 16/519,816, filed on Jul. 23, 2019, now Pat. No. 11,201,311, which is a continuation of application No. 15/943,967, filed on Apr. 3, 2018, now Pat. No. 10,593,905, which is a continuation of application No. 15/347,507, filed on Nov. 9, 2016, now Pat. No. 9,966,554.

(51) Int. Cl.
*H10K 59/131* (2023.01)
*H10K 59/80* (2023.01)
*H10K 71/70* (2023.01)
*H10K 102/00* (2023.01)

(52) U.S. Cl.
CPC ... *H10K 59/1315* (2023.02); *H10K 59/80518* (2023.02); *H10K 59/80522* (2023.02); *H10K 71/70* (2023.02); *H10K 2102/3026* (2023.02)

(56) References Cited

U.S. PATENT DOCUMENTS

| | | | | |
|---|---|---|---|---|
| 11,818,910 | B2 * | 11/2023 | Lee | H10K 59/122 |
| 2001/0050730 | A1 | 12/2001 | Tsukao | |
| 2007/0091241 | A1 * | 4/2007 | Lin | G02F 1/136259 349/144 |
| 2007/0126460 | A1 | 6/2007 | Chung et al. | |
| 2008/0309233 | A1 | 12/2008 | Hasegawa et al. | |
| 2011/0272675 | A1 | 11/2011 | Chung et al. | |
| 2012/0026415 | A1 | 2/2012 | Tsubata | |
| 2012/0169683 | A1 | 7/2012 | Hong | |
| 2012/0267611 | A1 | 10/2012 | Chung et al. | |
| 2013/0161656 | A1 | 6/2013 | Choi et al. | |
| 2013/0240914 | A1 | 9/2013 | Jin et al. | |
| 2014/0183479 | A1 | 7/2014 | Park et al. | |
| 2014/0312323 | A1 | 10/2014 | Park et al. | |
| 2015/0021564 | A1 | 1/2015 | Hong et al. | |
| 2015/0079703 | A1 | 3/2015 | Jin et al. | |
| 2015/0097171 | A1 | 4/2015 | Kim et al. | |
| 2015/0144904 | A1 | 5/2015 | Jeong et al. | |
| 2016/0155790 | A1 | 6/2016 | Lee et al. | |
| 2016/0172619 | A1 | 6/2016 | Hwang et al. | |
| 2016/0189593 | A1 * | 6/2016 | Lee | H10K 59/123 438/4 |

FOREIGN PATENT DOCUMENTS

| | | |
|---|---|---|
| KR | 10-2015-0041509 A | 4/2015 |
| KR | 10-2015-0113530 A | 10/2015 |

OTHER PUBLICATIONS

United States Office Action, U.S. Appl. No. 15/943,967, filed Oct. 1, 2018, 13 pages.
United States Office Action, U.S. Appl. No. 15/943,967, filed Mar. 11, 2019, 10 pages.
United States Office Action, U.S. Appl. No. 16/519,816, filed Nov. 10, 2020, 14 pages.
United States Office Action, U.S. Appl. No. 16/519,816, filed Mar. 30, 2021, 14 pages.
United States Office Action, U.S. Appl. No. 17/522,042, filed Feb. 15, 2023, eight pages.

* cited by examiner

ORGANIC LIGHT EMITTING DISPLAY DEVICE AND METHOD OF MANUFACTURING THE SAME

CROSS REFERENCE TO RELATED APPLICATIONS

This application is a continuation of U.S. patent application Ser. No. 17/522,042 filed on Nov. 9, 2021, which is a continuation of U.S. patent application Ser. No. 16/519,816 filed on Jul. 23, 2019, which is a continuation of U.S. patent application Ser. No. 15/943,967 filed on Apr. 3, 2018, which is a continuation of U.S. patent application Ser. No. 15/347,507 filed on Nov. 9, 2016, which claims the benefit of Korean Patent Application No. 10-2015-0157090 filed on Nov. 10, 2015, each of which is hereby incorporated by reference in its entirety.

BACKGROUND

Field of the Invention

The present invention relates to an organic light emitting display (OLED) device, and more particularly, to a top emission type OLED device and a method of manufacturing the same.

Discussion of the Related Art

An organic light emitting display (OLED) device is a self-light emitting display device, and has many advantages such as low power consumption, fast response speed, high light emission efficiency, high luminance and wide viewing angle. The OLED device is categorized into a top emission type and a bottom emission type depending on the direction in which the light emitted from an organic light emitting diode is transmitted.

In the bottom emission type OLED device, since a circuit element is disposed between a light emitting layer and an image display surface, the aperture ratio may be lowered due to the circuit element. On the other hand, the top emission type OLED device has a higher aperture ratio, because a circuit element is not disposed between a light emitting layer and an image display surface.

FIG. 1 is a cross-sectional view illustrating a top emission type organic light emitting display device according to the related art.

As illustrated in FIG. 1, a thin film transistor layer T, a passivation layer 20, a first planarization layer 31, a second planarization layer 32, a first anode electrode 40, a second anode electrode 60, a first auxiliary electrode 50, a second auxiliary electrode 70, a bank 80, a partition wall 92, an organic light emitting layer 94, and a cathode electrode 96 are formed in an active area AA on a substrate 10.

The thin film transistor layer T includes an active layer 11, a gate insulating film 12, a gate electrode 13, an interlayer dielectric 14, a source electrode 15, and a drain electrode 16.

The first anode electrode 40 and the first auxiliary electrode 50 are formed on the first planarization layer 31, and the second anode electrode 60 and the second auxiliary electrode 70 are formed on the second planarization layer 32. The first auxiliary electrode 50 serves to reduce the resistance of the cathode electrode 96 together with the second auxiliary electrode 70.

The bank 80 is formed on the second anode electrode 60 and the second auxiliary electrode 70 to define a pixel area, the organic light emitting layer 94 is formed within the pixel area defined by the bank 80, and the cathode electrode 96 is formed on the organic light emitting layer 94.

The partition wall 92 is formed on the second auxiliary electrode 70. The partition wall 92 is spaced apart from the bank 80 at a predetermined distance, and the second auxiliary electrode 70 is connected with the cathode electrode 96 through the spaced area between the partition wall 92 and the bank 80 to reduce the resistance of the cathode electrode 96.

In case of the top emission type, the light emitted from the organic light emitting layer 94 passes through the cathode electrode 96. Therefore, the cathode electrode 96 is typically formed using a transparent conductive material, which increases the resistance of the cathode electrode 96. In order to reduce the resistance of the cathode electrode 96, the cathode electrode 96 is connected with the first auxiliary electrode 50 and the second auxiliary electrode 70.

Particularly, the OLED device illustrated in FIG. 1 includes two auxiliary electrodes of the first auxiliary electrode 50 and the second auxiliary electrode 70, which are connected with each other to reduce the resistance of the cathode electrode 96. In such a case, because the second auxiliary electrode 70 is formed on the same layer as the second anode electrode 60, if a width of the second auxiliary electrode 70 increases to reduce the resistance of the cathode electrode 96, a width of the second anode electrode 60 is desired to be reduced, which may reduce the pixel area. Therefore, there is limitation in increasing the width of the second auxiliary electrode 70.

To address such a problem, the first auxiliary electrode 50 is additionally formed below the second auxiliary electrode 70 to reduce the resistance of the cathode electrode 96, without reducing the pixel area.

The aforementioned top emission type transparent OLED device according to the related art may have the following problems.

An array test is typically performed to determine whether there is any electrical defect in electrodes formed on the substrate 10 in which a test signal is applied to an electrode of each layer and the charge of the second anode electrode 60 is checked through an image in each pixel. Specifically, the transparent OLED device includes a transmissive portion and a light emitting portion, and all the elements of the light emitting portion are vertically deposited, as illustrated in FIG. 1, to obtain an enlarged area of the transmissive portion and improve transmittance.

When an array test is performed for the OLED device in which the thin film transistor layer T, the first anode electrode 40, and the second anode electrode 60 are vertically deposited as illustrated in FIG. 1, if a test signal is applied to the second anode electrode 60 to determine whether there is any defect in the second anode electrode 60 by checking an image in each pixel, the defect of the second anode electrode 60 may not be accurately tested due to interference caused by the thin film transistor layer T and the first anode electrode 60, which are deposited below the second anode electrode 60.

Particularly, since a low potential voltage Vss signal is applied to the first auxiliary electrode 50 formed in the light emitting portion of each pixel, the result of the array test for all pixels is represented by the same image, and thus, it may not be possible to determine whether there is any defect in the second anode electrode 60 of a specific pixel.

SUMMARY

Accordingly, the present invention is directed to an organic light emitting display device and a method of manufacturing the same, which substantially obviate one or more problems due to limitations and disadvantages of the related art.

An advantage of embodiments of the present invention is to provide an organic light emitting display device with improved repairability and a method of manufacturing the same.

Additional advantages and features of embodiments of the present invention will be set forth in part in the description which follows and in part will become apparent to those having ordinary skill in the art upon examination of the following or may be learned from practice of the invention. The objectives and other advantages of embodiments of the present invention may be realized and attained by the structure particularly pointed out in the written description and claims hereof as well as the appended drawings.

To achieve these objects and other advantages and in accordance with the purpose of the invention, as embodied and broadly described herein, an organic light emitting display device may, for example, include a substrate having a plurality of pixels, each pixel including a light emitting area and a transmissive area; an anode electrode in the light emitting area; an organic light emitting layer on the anode electrode; a cathode electrode on the organic light emitting layer; an auxiliary electrode connected with the cathode electrode; and a connection electrode connected with the anode electrode and provided in the transmissive area.

In another aspect, a method of manufacturing an organic light emitting display device may, for example, include forming a first anode electrode and a first auxiliary electrode spaced apart from the first anode electrode, in a light emitting area on a substrate having a plurality of pixels, each pixel including a light emitting area and a transmissive area; forming a planarization layer on the first anode electrode and the first auxiliary electrode and respectively forming contact holes, which externally expose the first anode electrode and the first auxiliary electrode, by removing a predetermined area of the planarization layer; and forming a second anode electrode and a second auxiliary electrode on the planarization layer, the second anode electrode being connected with the first anode electrode and the second auxiliary electrode being connected with the second auxiliary electrode, wherein a connection electrode connected with the first anode electrode is formed in the transmissive area when forming the first anode electrode and the first auxiliary electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE ILLUSTRATED EMBODIMENTS

Figure 1:
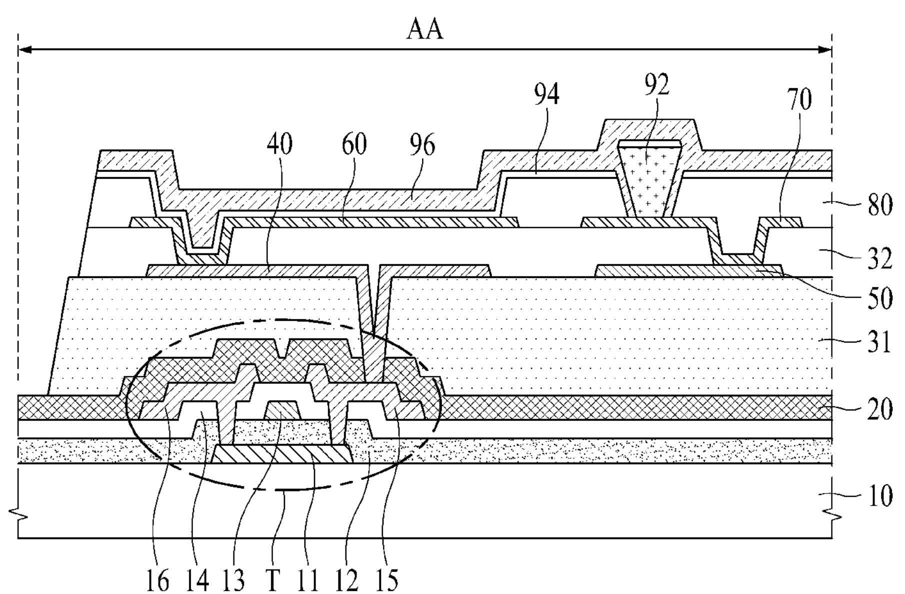
FIG. 1 is a cross-sectional view illustrating a top emission type organic light emitting display device according to the related art.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only-' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another element. Therefore, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, reference will now be made in detail to embodiments of the present invention, examples of which are illustrated in the accompanying drawings.

Figure 2:
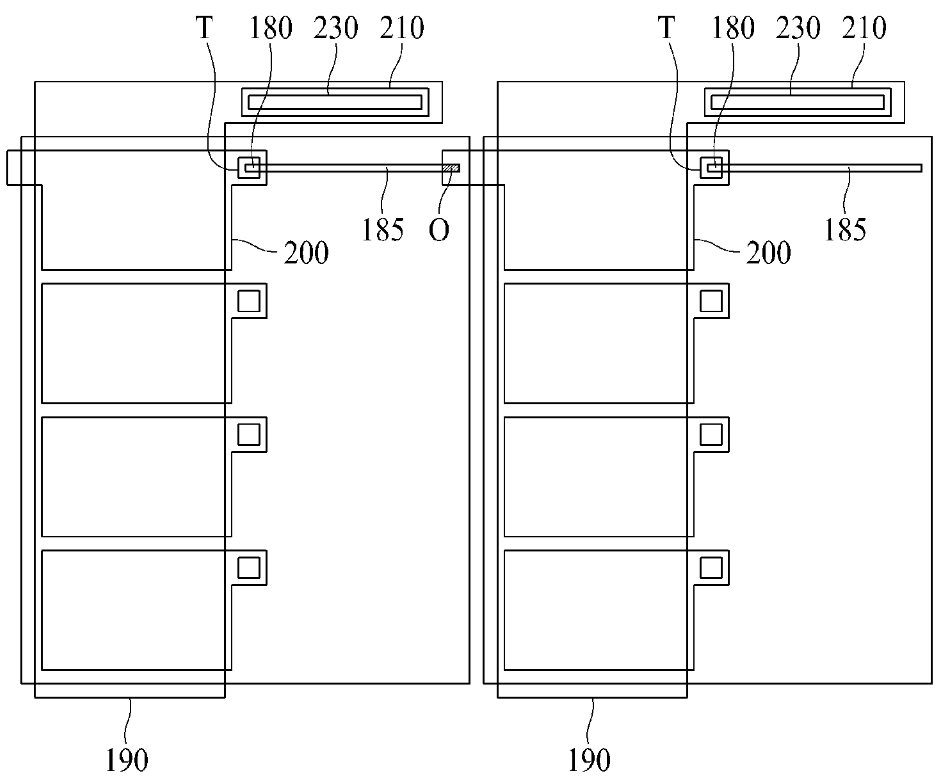
FIG. 2 is a plane view illustrating an organic light emitting display device according to one embodiment of the present invention.
Figure 3:
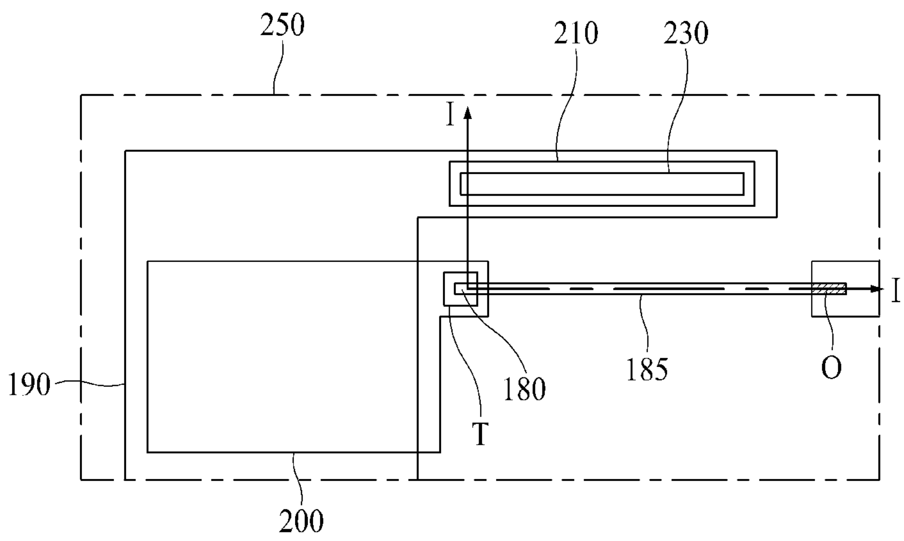
FIG. 3 is an enlarged view illustrating one sub pixel and an auxiliary electrode in the organic light emitting display device illustrated in FIG. 2.

FIG. 2 is a plane view illustrating an organic light emitting display (OLED) device according to one embodiment of the present invention. FIG. 3 is an enlarged view illustrating one sub pixel and an auxiliary electrode in the OLED device illustrated in FIG. 2.

Referring to FIGS. 2 and 3, the OLED device according to one embodiment of the present invention includes a plurality of pixels on a substrate, wherein each pixel includes a transmissive area and a light emitting area provided with four sub pixels.

The four sub pixels may be comprised of, but not limited to, sub pixels that emit red (R) light, white (W) light, blue (B) light, and green (G) light. Hereinafter, each of the four sub pixels will be described in detail.

The light emitting area of each of the sub pixels is provided with a thin film transistor T, a first anode electrode 180, a first auxiliary electrode 190, a second anode electrode 200, and a cathode electrode 250.

The thin film transistor T is formed in a pixel area of each sub pixel. The thin film transistor T supplies a data signal from a data line (not shown) to the first anode electrode 180 in response to a gate signal from a gate line (not shown).

The first anode electrode 180 is formed within the pixel area. The first anode electrode 180 is connected with a source electrode (not shown) of the thin film transistor T through a contact hole, and receives the data signal from the thin film transistor T.

The first auxiliary electrode 190 is formed to be spaced apart from the first anode electrode 180 in the light emitting area. The first auxiliary electrode 190 is connected to the cathode electrode 250 together with the second auxiliary electrode 210, which will be described later, and lowers the resistance of the cathode electrode 250. The first auxiliary electrode 190 may be formed of the same material and thickness as those of the first anode electrode 180 on the same layer as the first anode electrode 180. The first auxiliary electrode 190 and the first anode electrode 180 may beneficially be formed through the same process at the same time.

The second anode electrode 200 is formed within the light emitting area of each sub pixel. The second anode electrode 200 is connected with the first anode electrode 180 through a contact hole, and receives the data signal from the first anode electrode 180.

The cathode electrode 250 is formed in an entire area including the light emitting area, the transmissive area, and an area between the transmissive areas. The cathode electrode 250 is supplied with a driving power source from a driving power supply (not shown).

A connection electrode 185, which is connected to the first anode electrode 180, and the cathode electrode 250, are formed in the transmissive area of each of the sub pixels. The cathode electrode 250 is extended from the light emitting area of each of the sub-pixels as described above, and thus its repeated description will be omitted.

The first anode electrode 180 may include a first lower anode electrode (not shown), a first upper anode electrode (not shown), and a first cover anode electrode 183. The first anode electrode 180, which is comprised of a plurality of layers including all of the first lower anode electrode (not shown), the first upper anode electrode (not shown) and the first cover anode electrode 183, is formed in the light emitting area of each of the sub pixels, and the connection electrode 185 connected with the first cover anode electrode 183 of the first anode electrode 180 is formed in the transmissive area of each pixel, as illustrated in FIGS. 2 and 3. The connection electrode 185 may beneficially be formed through the same process as that of the first cover anode electrode 183 simultaneously with the first cover anode electrode 183.

In one embodiment of the present invention, when an array test is performed for the OLED device to determine whether there is any defect in the second anode electrode 200, a test signal applied to the second anode electrode 200 is recognized through the connection electrode 185 formed in the transmissive area. By doing so, interference caused by the signals of the thin film transistor T, the first anode electrode 180 and the first auxiliary electrode 190, which are formed below the second anode electrode 200, may be removed to perform only the test for the defect of the second anode electrode 200.

That is, according to the related art, the test signal applied to the second anode electrode 200 is recognized in the light emitting area where the thin film transistor T, the first anode electrode 180, the first auxiliary electrode 190, and the second anode electrode 190 are vertically deposited. As a result, it may be difficult to accurately test the defect of the second anode electrode 200 due to interference caused by the signals of the thin film transistor T, the first anode electrode 180 and the first auxiliary electrode 190. However, in the embodiment of the present invention, the test signal applied to the second anode electrode 200 is recognized in the transmissive area where the thin film transistor T, the first anode electrode 180 and the first auxiliary electrode 190 are not deposited, and thus, the defect of the second anode electrode 200 may be accurately tested.

Particularly, the connection electrode 185 according to one embodiment of the present invention may be made of a transparent conductive material such as ITO in the transmissive area so as not to affect transmittance of each pixel.

As described above, in the OLED device according to one embodiment of the present invention, the connection electrode 185 made of a transparent conductive material such as ITO is formed to be extended from the first cover anode electrode 183 in the transmissive area, and the test signal of the second anode electrode 200 is recognized through the connection electrode 185, and thus, the defect of the second anode electrode 200 may be tested even without affecting transmittance of each pixel.

Particularly, in the transmissive area of each of the sub pixels, the connection electrode 185 is formed to overlap (O) a second anode electrode of a corresponding one of sub pixels of another adjacent pixel. Therefore, when a defect occurs in the second anode electrode 200 of a specific sub pixel, the defective pixel may simply be repaired by, for example, welding the connection electrode 185 of the specific sub pixel to the second anode electrode of another adjacent sub pixel.

At this time, the corresponding sub pixel means a sub pixel that emits the same light as red (R) light, white (W) light, blue (B) light, or green (G) light, which is emitted from the sub pixel that includes the second anode electrode 200 where a defect occurs. That is, in one embodiment of the present invention, the connection electrode 185 of the specific pixel is formed to overlap (O) the second anode electrode of another sub pixel, and when a defect occurs in the second anode electrode of the specific pixel, the connection electrode 185 of the specific pixel and the second anode electrode of another adjacent sub pixel are, for example, welded by a laser to simply repair the defective. Instead of a laser welding, various types of repair methods can be used to connect the connection electrode 185 and the second anode electrode of another sub pixel.

The first auxiliary electrode 190, the second auxiliary electrode 210, the partition wall 230 and the cathode electrode 250 are formed between the plurality of pixels, specifically between the transmissive areas of the plurality of pixels. The first auxiliary electrode 190 and the cathode electrode 250 are formed to be extended from the light emitting area of each pixel, as described above, and thus, their repeated descriptions will be omitted.

The second auxiliary electrode 210 is formed to be spaced apart from the second anode electrode 200 on the first auxiliary electrode 180. The second auxiliary electrode 210 is connected to the first auxiliary electrode 190 through a contact hole, and is connected to the cathode electrode 250 together with the first auxiliary electrode 190 to lower the resistance of the cathode electrode 250. The second auxiliary electrode 210 may be formed of the same material and the same thickness as those of the second anode electrode 200 on the same layer as the second anode electrode 200. The second auxiliary electrode 210 may beneficially be formed through the same process as that of the second anode electrode 200 simultaneously with the second anode electrode 200.

The partition wall 230 is formed on the second auxiliary electrode 210. The partition wall 230 is spaced apart from a bank (not shown) at a predetermined distance, and the second auxiliary electrode 210 and the cathode electrode 250 are electrically connected with each other through the spaced area between the partition wall 230 and the bank.

In one embodiment of the present invention, the first auxiliary electrodes 190 of the respective sub pixels that emit red (R) light, white (W) light, blue (B) light, and green (G) light are formed in a single body as illustrated. However, the present embodiment is not limited to this example, and the first auxiliary electrodes 190 of the respective sub pixels may be formed to be spaced apart from each other. In this case, the first auxiliary electrodes 190 of the respective sub pixels may be formed to be connected with the second auxiliary electrodes 210 which exist separately for each sub pixel.

Hereinafter, a structure of an OLED device according to one embodiment of the present invention, which may perform a test for a defect of the second anode electrode 200 by removing interference caused by the signals of the thin film transistor T, the first anode electrode 180 and the first auxiliary electrode 190 and repair a pixel where the defect occurs, will be described in detail.

Figure 4:
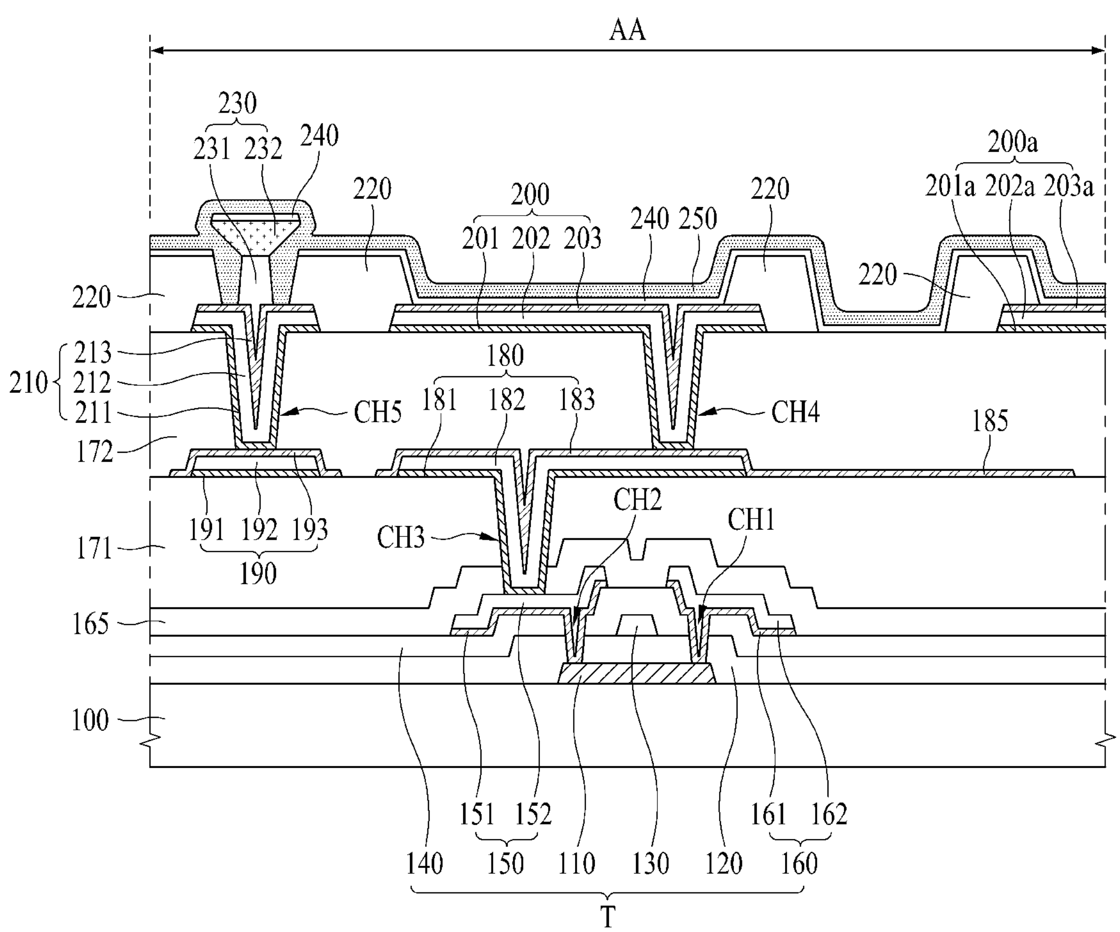
FIG. 4 is a cross-sectional view illustrating an organic light emitting display device according to one embodiment of the present invention, which is taken along line "I-I" in FIG. 3.

FIG. 4 is a cross-sectional view illustrating an OLED device according to one embodiment of the present invention, which is taken along line "I-I" in FIG. 3.

Referring to FIG. 4, the organic light emitting display device according to one embodiment of the present invention includes an active area AA and a pad area (not shown), which are provided on a substrate 100.

A thin film transistor layer T, a passivation layer 165, a first planarization layer 171, a second planarization layer 172, a first anode electrode 180, a second anode electrode 200, a first auxiliary electrode 190, a second auxiliary electrode 210, a connection electrode 185, a bank 220, a partition wall 230, an organic light emitting layer 240, and a cathode electrode 250 are formed in the active area AA on the substrate 100.

The thin film transistor layer T includes an active layer 110, a gate insulating film 120, a gate electrode 130, an interlayer dielectric 140, a source electrode 150, and a drain electrode 160.

The active layer 110 is formed to be overlapped with the gate electrode 130 on the substrate 100. The active layer 110 may be made of a silicon based semiconductor material or an oxide based semiconductor material. Although not shown, a light shielding film may additionally be formed between the substrate 100 and the active layer 110. In this case, external light entering the display device through a lower surface of the substrate 100 is shielded by the light shielding film, and thus, damage to the active layer 110 by the external light may be avoided.

The gate insulating film 120 is formed on the active layer 110. The gate insulating film 120 serves to insulate the active layer 110 from the gate electrode 130. The gate insulating film 120 may be made of, but not limited to, an inorganic insulating material, for example, a silicon oxide (SiOx) film, a silicon nitride (SiNx) film, or multiple layers thereof. The gate insulating film 120 may be formed to be extended to an entire active area AA that includes a transmissive area.

The gate electrode 130 is formed on the gate insulating film 120. The gate electrode 130 is formed to overlap the active layer 110 by interposing the gate insulating film therebetween. The gate electrode 130 may be made of, but not limited to, a single layer or multiple layers including any one of Mo, Al, Cr, Au, Ti, Ni, Nd and Cu or their alloy.

The interlayer dielectric 140 is formed on the gate electrode 130. The interlayer dielectric 140 may be made of, but not limited to, the same inorganic insulating material as that of the gate insulating film 120, for example, a silicon oxide (SiOx) film, a silicon nitride (SiNx) film, or multiple layers thereof. The interlayer dielectric 140 may be formed to be extended to an entire active area AA that includes a transmissive area.

The source electrode 150 and the drain electrode 160 are formed to face each other on the interlayer dielectric 140. A first contact hole CH1, which exposes one end area of the active layer 110, and a second contact hole CH2, which exposes the other end area of the active layer 110, are provided in the aforementioned gate insulating film 120 and the interlayer dielectric 140. The source electrode 150 is connected with the other end area of the active layer 110 through the second contact hole CH2, and the drain electrode 160 is connected with the one end area of the active layer 110 through the first contact hole CH1.

The source electrode 150 may include a lower source electrode 151 and an upper source electrode 152. The lower source electrode 151 may be formed between the interlayer dielectric 140 and the upper source electrode 152 to enhance adhesion between the interlayer dielectric 140 and the upper source electrode 152. Also, the lower source electrode 151 may reduce or prevent a lower surface of the upper source electrode 152 from being corroded by protecting the lower surface of the upper source electrode 152. Therefore, oxidation of the lower source electrode 151 may be smaller than that of the upper source electrode 152. That is, the lower source electrode 151 may be made of a material of which corrosion resistance is stronger than that of the upper source electrode 152. In this way, the lower source electrode 151 serves as an adhesion enhancement layer or an anti-corrosion layer, and may be made of, but not limited to, an alloy of Mo and Ti.

The upper source electrode 152 is formed on the lower source electrode 151. The upper source electrode 152 may be made of, but not limited to, Cu which is a metal having low resistance. The upper source electrode 152 may be made of a metal of which resistance is relatively lower than that of the lower source electrode 151. In order to reduce the resistance of the source electrode 150, the upper source electrode 152 may be formed to be thicker than the lower source electrode 151.

The drain electrode 160 may include a lower drain electrode 161 and an upper drain electrode 162 similar to the aforementioned source electrode 150. The lower drain electrode 161 may be formed between the interlayer dielectric 140 and the upper drain electrode 162 to enhance adhesion between the interlayer dielectric 140 and the upper drain electrode 162. Also, the lower drain electrode 161 may reduce or prevent a lower surface of the upper drain electrode 162 from being corroded. Therefore, oxidation of the lower drain electrode 161 may be smaller than that of the upper drain electrode 162. That is, the lower drain electrode 161 may be made of a material of which corrosion resistance is stronger than that of the upper drain electrode 162. In the same manner as the aforementioned lower source electrode 151, the lower drain electrode 161 may be made of, but not limited to, an alloy of Mo and Ti.

The upper drain electrode 162 is formed on the lower drain electrode 161. The upper drain electrode 162 may be made of, but not limited to, Cu in the same manner as the aforementioned upper source electrode 152. The upper drain electrode 162 may be beneficially formed to be thicker than the lower drain electrode 161 to reduce the resistance of the drain electrode 160.

The upper drain electrode 162 may be formed of the same material and the same thickness as those of the upper source electrode 152, and the lower drain electrode 161 may be formed of the same material and the same thickness as those of the lower source electrode 151. The drain electrode 160 and the source electrode 150 may beneficially be formed through the same process at the same time.

The structure of the aforementioned thin film transistor layer T is not limited to the shown structure, and it would be appreciated that various modifications may be made in the structure of the thin film transistor layer T. For example, although a top gate structure is shown in which the gate electrode 130 is formed above the active layer 110, the thin film transistor layer T may be formed of a bottom gate structure in which the gate electrode 130 is formed below the active layer 110.

The passivation layer 165 is formed on the thin film transistor layer T, more specifically on the source electrode 150 and the drain electrode 160. The passivation layer 165 serves to protect the thin film transistor layer T, and may be made of, but not limited to, an inorganic insulating material, for example, a silicon oxide (SiOx) film or a silicon nitride (SiNx) film. The passivation layer 165 may be formed to be extended to an entire active area AA that includes a transmissive area.

The first planarization layer 171 is formed on the passivation layer 165. The first planarization layer 171 serves to planarize an upper portion of the substrate 100 provided with the thin film transistor T. The first planarization layer 171 may be made of, but not limited to, an organic insulating material such as acryl resin, epoxy resin, phenolic resin, polyamides resin and polyimide resin. The first planarization layer 171 may be formed to be extended to an entire active area AA that includes a transmissive area.

The first anode electrode 180 and the first auxiliary electrode 190 are formed on the first planarization layer 171. That is, the first anode electrode 180 and the first auxiliary electrode 190 are formed on the same layer. The aforementioned passivation layer 165 and the aforementioned first planarization layer 171 are provided with a third contact hole CH3 that exposes the source electrode 150, and the source electrode 150 is connected with the first anode electrode 180 through the third contact hole CH3.

The first anode electrode 180 may include a first lower anode electrode 181, a first upper anode electrode 182, and a first cover anode electrode 183. The first lower anode electrode 181 may be formed between the first planarization layer 171 and the first upper anode electrode 182 to enhance adhesion between the first planarization layer 171 and the first upper anode electrode 182. Also, the first lower anode electrode 181 may reduce or prevent a lower surface of the first upper anode electrode 182 from being corroded by protecting the lower surface of the first upper anode electrode 182.

As a result, oxidation of the first lower anode electrode 181 may be smaller than that of the first upper anode electrode 182. That is, the first lower anode electrode 181 may be made of a material of which corrosion resistance is stronger than that of the first upper anode electrode 182. Also, the first lower anode electrode 181 may reduce or prevent the upper surface of the upper source electrode 152 from being corroded by protecting the upper surface of the upper source electrode 152. As a result, oxidation of the first lower anode electrode 181 may be smaller than that of the upper source electrode 152. That is, the first lower anode electrode 181 may be made of a material of which corrosion resistance is stronger than that of the upper source electrode 152. In this way, since the first lower anode electrode 181 may reduce or prevent the upper surface of the upper source electrode 152 from being corroded, the source electrode 150 may be formed in the aforementioned double-layered structure. The first lower anode electrode 181 serves as an adhesion enhancement layer or an anti-corrosion layer, and may be made of, but not limited to, an alloy of Mo and Ti.

The first upper anode electrode 182 is formed between the first lower anode electrode 181 and the first cover anode electrode 183. The first upper anode electrode 182 may be made of, but not limited to, Cu which is a metal having low resistance. The first upper anode electrode 182 may be made of a metal of which resistance is relatively lower than that of each of the first lower anode electrode 181 and the first cover anode electrode 183. In order to reduce the resistance of the first anode electrode 180, the first upper anode electrode 182 may beneficially be formed to be thicker than each of the first lower anode electrode 181 and the first cover anode electrode 183.

The first cover anode electrode 183 is formed on the first upper anode electrode 182. The first cover anode electrode 183 serves to reduce or prevent the first upper anode electrode 182 from being corroded by being formed to cover the upper surface and side of the first upper anode electrode 182. As a result, oxidation of the first cover anode electrode 183 may be smaller than that of the first upper anode electrode 182. That is, the first cover anode electrode 183 may be made of a material of which corrosion resistance is stronger than that of the first upper anode electrode 182.

The first cover anode electrode 183 may be formed to cover the side of the first lower anode electrode 181. At this time, oxidation of the first cover anode electrode 183 may be smaller than that of the first lower anode electrode 181. That is, the first cover anode electrode 183 may be made of a material of which corrosion resistance is stronger than that of the first lower anode electrode 181. The first cover anode electrode 183 may be made of, but not limited to, a transparent conductive material such as ITO.

The first auxiliary electrode 190 may include a first lower auxiliary electrode 191, a first upper auxiliary electrode 192, and a first cover auxiliary electrode 193 similar to the aforementioned first anode electrode 180. The first lower auxiliary electrode 191 may be formed between the first planarization layer 171 and the first upper auxiliary electrode 192 to enhance adhesion between the first planarization layer 171 and the first upper auxiliary electrode 192. Also, the first lower auxiliary electrode 191 may reduce or prevent a lower surface of the first upper auxiliary electrode 192 from being corroded. As a result, oxidation of the first lower auxiliary electrode 191 may be smaller than that of the first upper auxiliary electrode 192. That is, the first lower auxiliary electrode 191 may be made of a material of which corrosion resistance is stronger than that of the first upper auxiliary electrode 192. In this way, the first lower auxiliary electrode 191 may be made of, but not limited to, an alloy of Mo and Ti in the same manner as the aforementioned first lower anode electrode 181.

The first upper auxiliary electrode 192 is formed between the first lower auxiliary electrode 191 and the first cover auxiliary electrode 193, and may be may be made of, but not limited to, Cu in the same manner as the aforementioned first upper anode electrode 182. Preferably, the first upper auxiliary electrode 192 which has relatively low resistance is formed to be thicker than each of the first lower auxiliary electrode 191 and the first cover auxiliary electrode 193, each of which has relatively high resistance, whereby an entire resistance of the first auxiliary electrode 190 may be reduced.

The first cover auxiliary electrode 193 is formed on the first upper auxiliary electrode 192. The first cover auxiliary electrode 193 prevents the first upper auxiliary electrode 192 from being corroded by being formed to cover the upper surface and side of the first upper auxiliary electrode 192. As a result, oxidation of the first cover auxiliary electrode 193 may be smaller than that of the first upper auxiliary electrode 192. That is, the first cover auxiliary electrode 193 may be made of a material of which corrosion resistance is stronger than that of the first upper auxiliary electrode 192.

The first cover auxiliary electrode 193 may be formed to cover the side of the first lower auxiliary electrode 191. Also, oxidation of the first cover auxiliary electrode 193 may be smaller than that of the first lower auxiliary electrode 191. That is, the first cover auxiliary electrode 193 may be made of a material of which corrosion resistance is stronger than that of the first lower auxiliary electrode 191. The first cover auxiliary electrode 193 may be made of, but not limited to, a transparent conductive material such as ITO.

The first cover auxiliary electrode 193 may be formed of the same material and thickness as those of the first cover anode electrode 183, and the first upper auxiliary electrode 192 may be formed of the same material and the same thickness as those of the first upper anode electrode 182, and the first lower auxiliary electrode 191 may be formed of the same material and the same thickness as those of the first lower anode electrode 181. The first auxiliary electrode 190 and the first anode electrode 180 may beneficially be formed through the same process at the same time.

The connection electrode 185 is connected with the first anode electrode 180, and is formed to be extended to the transmissive area. In more detail, the connection electrode 185 is formed to be connected with the first cover anode electrode 183 of the first anode electrode 180.

Since the first cover anode electrode 183 is connected with the second anode electrode 200, the connection electrode 185 may recognize the test signal applied to the second anode electrode 200.

As a result, when an array test is performed for the OLED device to determine whether there is any defect in the second anode electrode 200, the test signal applied to the second anode electrode 200 is recognized through the first cover anode electrode 183 formed in the transmissive area. By doing so, interference caused by the signals of the thin film transistor T and the first anode electrode 180, which are formed below the second anode electrode 200, may be removed to perform the test for the defect of the second anode electrode 200.

Also, the connection electrode 185 may be made of a transparent conductive material such as ITO in the same manner as the first cover anode electrode 183 and the first cover auxiliary electrode 193, and may be formed at the same thickness as that of each of them. The first cover anode electrode 183 and the first cover auxiliary electrode 193 may beneficially be formed through the same process at the same time.

As described above, in the OLED device according to one embodiment of the present invention, the connection electrode 185 made of a transparent conductive material such as ITO is formed in the transmissive area, and the test signal of the second anode electrode 200 is recognized through the connection electrode 185, and thus, the defect of the second anode electrode 200 may be tested even without affecting transmittance of each pixel.

Also, the connection electrode 185 is formed to overlap a second anode electrode **200*a* of a corresponding one of sub pixels of another adjacent sub pixel. Therefore, if a defect occurs in a second anode electrode 200 of a specific sub pixel as a result of a test for the defect, the connection electrode 185 of the specific sub pixel and the second anode electrode 200*a* of another sub pixel are welded together by a laser to simply repair the defective pixel. The corresponding sub pixel means a sub pixel that emits the same light as red (R), white (W), blue (B), or green (G) light emitted from the sub pixel that includes the second anode electrode 200** where the defect occurs.

The second planarization layer 172 is formed on the first auxiliary electrode 190, the first anode electrode 180, and the connection electrode 185. The second planarization layer 172 serves to planarize the upper portion of the substrate 100 together with the aforementioned first planarization layer 171. The second planarization layer 172 may be made of, but not limited to, an organic insulating material such as acryl resin, epoxy resin, phenolic resin, polyamide resin and polyimide resin. The second planarization layer 172 may be formed to be extended to an entire active area AA that includes a transmissive area.

The second planarization layer 172 is provided with a fourth contact hole CH4 and a fifth contact hole CH5. The first anode electrode 180 is exposed by the fourth contact hole CH4, and the first auxiliary electrode 190 is exposed by the fifth contact hole CH5.

The second anode electrode 200 is formed on the second planarization layer 172. The second anode electrode 200 is connected with the first anode electrode 180 through the fourth contact hole CH4. The second anode electrode 200 serves to upwardly reflect the light emitted from the organic light emitting layer 240, and thus, is made of a material with excellent reflectance. The second anode electrode 200 may include a second lower anode electrode 201, a second center anode electrode 202 and a second upper anode electrode 203.

The second lower anode electrode 201 is formed between the first anode electrode 180 and the second center anode electrode 202. The second lower anode electrode 201 may prevent a lower surface of the second center anode electrode 202 from being corroded by protecting the lower surface of the second center anode electrode 202. As a result, oxidation of the second lower anode electrode 201 may be smaller than that of the second center anode electrode 202. That is, the second lower anode electrode 201 may be made of a material of which corrosion resistance is stronger than that of the second center anode electrode 202. In this way, the second lower anode electrode 201 may be made of, but not limited to, a transparent conductive material such ITO.

The second center anode electrode 202 is formed between the second lower anode electrode 201 and the second upper anode electrode 203. The second center anode electrode 202 is made of a material having a resistance lower than that of the second lower anode electrode 201 and the second upper anode electrode 203 and a reflectance more excellent than that of them, and may be, for example, made of, but not limited to, Ag. Preferably, the second center anode electrode 202 which has relatively low resistance is formed to be thicker than each of the second lower anode electrode 201 and the second upper anode electrode 203, each of which has relatively high resistance, and thus, an entire resistance of the second anode electrode 200 may be reduced.

The second upper anode electrode 203 may be formed on the second center anode electrode 202 to reduce or prevent an upper surface of the second center anode electrode 202 from being corroded. As a result, oxidation of the second upper anode electrode 203 may be smaller than that of the second center anode electrode 202. That is, the second upper anode electrode 203 may be made of a material of which corrosion resistance is stronger than that of the second center anode electrode 202. In this way, the second upper anode electrode 203 may be made of, but not limited to, a transparent conductive material such ITO.

The second auxiliary electrode 210 is formed on the second planarization layer 172 in the same manner as the second anode electrode 200. The second auxiliary electrode 210 is connected with the first auxiliary electrode 190 through the fifth contact hole CH5. The second auxiliary electrode 210 serves to lower resistance of the cathode electrode 250 together with the first auxiliary electrode 190.

The second auxiliary electrode 210 may include a second lower auxiliary electrode 211, a second center auxiliary electrode 212, and a second upper auxiliary electrode 213.

The second lower auxiliary electrode 211 is formed between the first auxiliary electrode 190 and the second center auxiliary electrode 212. The second lower auxiliary electrode 211 may reduce or prevent a lower surface of the second center auxiliary electrode 212 from being corroded by protecting the lower surface of the second center auxiliary electrode. As a result, oxidation of the second lower auxiliary electrode 211 may be smaller than that of the second center auxiliary electrode 212. That is, the second lower auxiliary electrode 211 may be made of a material of which corrosion resistance is stronger than that of the second center auxiliary electrode 212. In this way, the second lower auxiliary electrode 211 may be made of, but not limited to, a transparent conductive material such as ITO.

The second center auxiliary electrode 212 is formed between the second lower auxiliary electrode 211 and the second upper auxiliary electrode 213. The second center auxiliary electrode 212 is made of a material having a resistance lower than that of the second lower auxiliary electrode 211 and the second upper auxiliary electrode 213 and a reflectance more excellent than that of them, and may be, for example, made of, but not limited to, Ag. Preferably, the second center auxiliary electrode 212 which has relatively low resistance is formed to be thicker than each of the second lower auxiliary electrode 211 and the second upper auxiliary electrode 213, each of which has relatively high resistance, whereby entire resistance of the second auxiliary electrode 210 may be reduced.

The second upper auxiliary electrode 213 may be formed on the second center auxiliary electrode 212 to reduce or prevent an upper surface of the second center auxiliary electrode 212 from being corroded. As a result, oxidation of the second upper auxiliary electrode 213 may be smaller than that of the second center auxiliary electrode 212. That is, the second upper auxiliary electrode 213 may be made of a material of which corrosion resistance is stronger than that of the second center auxiliary electrode 212. In this way, the second upper auxiliary electrode 213 may be made of, but not limited to, a transparent conductive material such ITO.

The second upper auxiliary electrode 213 may be formed of the same material and the same thickness as those of the second upper anode electrode 203, and the second center auxiliary electrode 212 may be formed of the same material and the same thickness as those of the second center anode electrode 202, and the second lower auxiliary electrode 211 may be formed of the same material and thickness as those of the second lower anode electrode 201. The second auxiliary electrode 210 and the second anode electrode 200 may beneficially be formed through the same process at the same time.

According to one embodiment of the present invention, two auxiliary electrodes of the first auxiliary electrode 190 and the second auxiliary electrode 210, which are connected with each other to reduce the resistance of the cathode electrode 250, may be formed to more easily control resistance properties of the auxiliary electrodes.

In more detail, since the second auxiliary electrode 210 is formed on the same layer as the second anode electrode 200, if a width of the second auxiliary electrode 210 increases, a width of the second anode electrode 200 is desired to be reduced, which may reduce the pixel area. Therefore, there is limitation in increasing the width of the second auxiliary electrode 210. In this respect, according to one embodiment of the present invention, the first auxiliary electrode 190 connected with the second auxiliary electrode 210 may additionally be formed below the second auxiliary electrode 210 to effectively lower the resistance of the cathode electrode 250 even without reducing the pixel area.

The first auxiliary electrode 190 is formed on the same layer as the first anode electrode 180, and serves to connect the source electrode 150 with the second anode electrode 200, whereby a width of the first anode electrode 180 may be reduced, and thus a width of the first auxiliary electrode 190 may increase. That is, the width of the first auxiliary electrode 190 may be formed to be greater than that of the first anode electrode 180. Moreover, the width of the first auxiliary electrode 190 may increase such that the first auxiliary electrode 190 may be overlapped with the second anode electrode 200. As a result, the resistance of the cathode electrode 250 may be lowered more effectively.

The bank 220 is formed on the second anode electrode 200 and the second auxiliary electrode 210. The bank 220 is formed on one side and the other side of the second anode electrode 200 while exposing the upper surface of the second anode electrode 200. As the bank 220 is formed to expose the upper surface of the second anode electrode 200, an area where an image is displayed may be obtained. Also, as the bank 220 is formed on one side and the other side of the second anode electrode 200, the side of the second center anode electrode 202, which is vulnerable to corrosion, may be reduced or prevented from being exposed to the outside, whereby the side of the second center anode electrode 202 may be reduced or prevented from being corroded.

The bank 220 is formed on one side and the other side of the second auxiliary electrode 210 while exposing the upper surface of the second auxiliary electrode 210. As the bank 220 is formed to expose the upper surface of the second auxiliary electrode 210, an electrical connection space between the second auxiliary electrode 210 and the cathode electrode 250 may be obtained. Also, as the bank 220 is formed on one side and the other side of the second auxiliary electrode 210, the side of the second center auxiliary electrode 212, which is vulnerable to corrosion, is reduced or prevented from being exposed to the outside, whereby the side of the second center auxiliary electrode 212 may be reduced or prevented from being corroded.

Also, the bank 220 is formed between the second anode electrode 200 and the second auxiliary electrode 210 to insulate the second electrode 200 and the second auxiliary electrode 210 from each other. The bank 220 may be made of, but not limited to, an organic insulating material such as polyimide resin, acryl resin, and BCB.

The partition wall 230 is formed on the second auxiliary electrode 210. The partition wall 230 is spaced apart from the bank 220 at a predetermined distance, and the second auxiliary electrode 210 is connected with the cathode electrode 250 through the spaced area between the partition wall 230 and the bank 220. The partition wall 230 may not be formed, whereby the second auxiliary electrode 210 may electrically be connected with the cathode electrode 250 without the partition wall 230. If the partition wall 230 is formed, the organic light emitting layer 240 may, however, be deposited more easily. This will be now described in more detail.

If the partition wall 230 is not formed, a mask pattern that covers the upper surface of the second auxiliary electrode 210 when the organic light emitting layer 240 is deposited may be required such that the upper surface of the second auxiliary electrode 210 is not covered by the organic light emitting layer 240. However, if the partition wall 230 is formed, its upper surface serves as eaves when the organic light emitting layer 240 is deposited, whereby the organic light emitting layer 240 is not deposited on an area below the eaves. In this case, a mask pattern that covers the upper surface of the second auxiliary electrode 210 may not be required. That is, based on a front surface, if the upper surface of the partition wall 230 serving as the eaves is formed to cover the spaced area between the partition wall 230 and the bank 220, the organic light emitting layer 240 is not permeated into the spaced area between the partition wall 230 and the bank 220, whereby the second auxiliary electrode 210 may be exposed from the spaced area between the partition wall 230 and the bank 220. Particularly, since the organic light emitting layer 240 may be formed through a deposition process such as evaporation in which linearity of a deposition material is excellent, the organic light emitting layer 240 is not deposited on the spaced area between the partition wall 230 and the bank 220.

In order that the upper surface of the partition wall 230 serves as the eaves as described above, a width of the upper surface of the partition wall 230 is formed to be greater than that of the lower surface of the partition wall 230. The partition wall 230 may include a first partition wall 231 and a second partition wall 232. The first partition wall 231 is formed on the second auxiliary electrode 210, and may be formed of the same material as that of the bank 220 through the same process as that of the bank 220. The second partition wall 232 is formed on the first partition wall 231. A width of the upper surface of the second partition wall 232 is formed to be greater than that of the lower surface of the second partition wall 232. Particularly, as the second partition wall 232 may be formed such that the upper surface of the second partition wall 232 covers the spaced area between the partition wall 230 and the bank 220, the second partition wall 232 may serve as the eaves.

The organic light emitting layer 240 is formed on the second anode electrode 200. The organic light emitting layer 240 may include a hole injecting layer, a hole transporting layer, an emitting layer, an electron transporting layer, and an electron injecting layer. Various modifications known in the art may be made in the organic light emitting layer 240.

The organic light emitting layer 240 may be extended to the upper surface of the bank 220. However, the organic light emitting layer 240 is not extended to the upper surface of the second auxiliary electrode 210 while covering the upper surface of the second auxiliary electrode 210. This is because it may be difficult to electrically connect the second auxiliary electrode 210 with the cathode electrode 250 if the organic light emitting layer 240 covers the upper surface of the second auxiliary electrode 210. As described above, the organic light emitting layer 240 may be formed through a deposition process without a mask that covers the upper surface of the second auxiliary electrode 210. In this case, the organic light emitting layer 240 may be formed even on the partition wall 230.

The cathode electrode 250 is formed on the organic light emitting layer 240. Since the cathode electrode 250 is formed on a surface to which light is emitted, the cathode electrode 250 is made of a transparent conductive material. Since the cathode electrode 250 is made of a transparent conductive material, its resistance is high. Therefore, the cathode electrode 250 is connected with the second auxiliary electrode 210 to reduce resistance. That is, the cathode electrode 250 is connected with the second auxiliary electrode 210 through the spaced area between the partition wall 230 and the bank 220. Since the cathode electrode 250 may be formed through a deposition process such as sputtering, in which linearity of a deposition material is not good, the cathode electrode 250 may be deposited on the spaced area between the partition wall 230 and the bank 220.

Although not shown, an encapsulation layer may additionally be formed on the cathode electrode 250 to reduce or prevent water permeation from occurring. Various materials known in the art may be used as the encapsulation layer. Also, although not shown, a color filter per pixel may additionally be formed on the cathode electrode 250, and in this case, white light may be emitted from the organic light emitting layer 240.

FIGS. 5A to 5H are cross-sectional views illustrating a method of manufacturing an OLED device according to one embodiment of the present invention, as it applies to the aforementioned OLED device illustrated in FIG. 4 by way of example. The same reference numbers will be used throughout the drawings to refer to the same or like parts, and repeated description in material and structure of each element will be omitted.

Figure 5A:
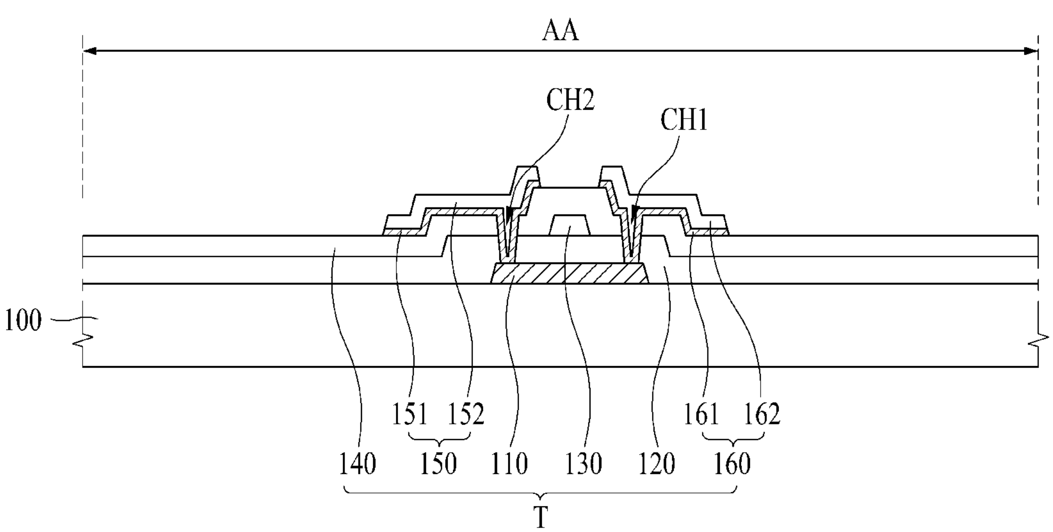
FIGS. 5A to 5H are cross-sectional views illustrating a method of manufacturing an organic light emitting display device according to one embodiment of the present invention.

First of all, as illustrated in FIG. 5A, an active layer 110, a gate insulating film 120, a gate electrode 130, an interlayer dielectric 140, a source electrode 150, and a drain electrode 160 are sequentially formed on a substrate 100.

In more detail, the active layer 110 is formed on the substrate 100, the gate insulating film 120 is formed on the active layer 110, the gate electrode 130 is formed on the gate insulating film 120, the interlayer dielectric 140 is formed on the gate electrode 130, and a first contact hole CH1 and a second contact hole CH2 are formed in the gate insulating film 120 and the interlayer dielectric 140. Afterwards, the drain electrode 160 connected with one end area of the active layer 110 through the first contact hole CH1 and the source electrode 150 connected with the other end area of the active layer 110 through the second contact hole CH2 are formed.

In this case, the active layer 110, the gate electrode 130, the source electrode 150 and the drain electrode 160 are formed in the light emitting area of the substrate 100, and the gate insulating film 120 and the interlayer dielectric 140 are formed to be extended to an entire active area AA that includes a light emitting area and a transmissive area.

The source electrode 150 includes a lower source electrode 151 and an upper source electrode 152, and the drain electrode 160 includes a lower drain electrode 161 and an upper drain electrode 162. The source electrode 150 and the drain electrode 160 may be formed of the same material through the same patterning process at the same time.

Figure 5B:
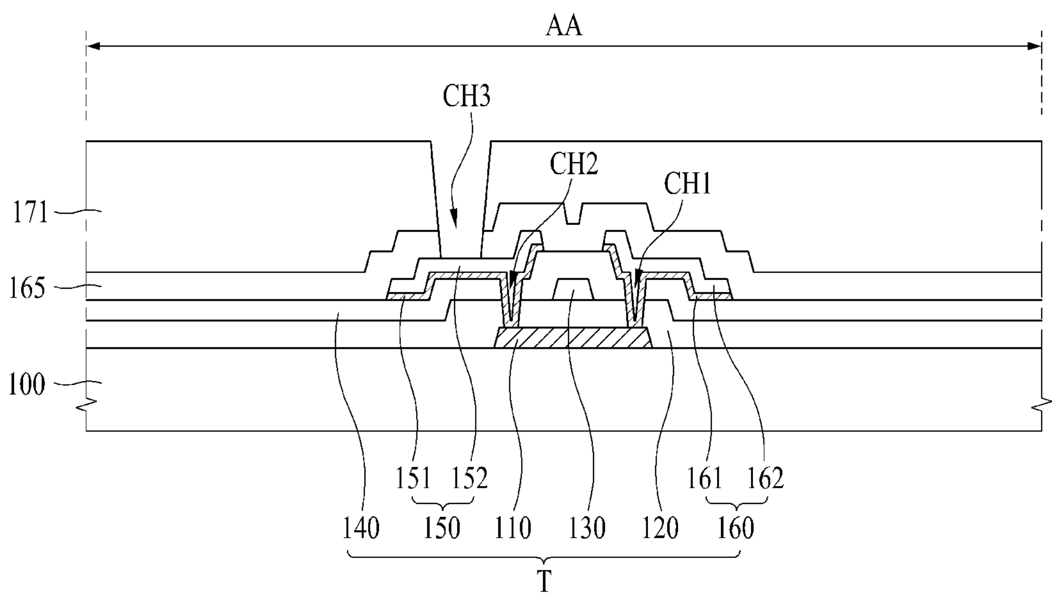

Next, as illustrated in FIG. 5B, a passivation layer 165 is formed on the source electrode 150 and the drain electrode 160, and a first planarization layer 171 is formed on the passivation layer 165. The passivation layer 165 and the first planarization layer 171 are formed to be extended to an entire active area AA that includes a light emitting area and a transmissive area.

The passivation layer 165 and the first planarization layer 171 are formed to be extended to an entire active area AA that includes a light emitting area and a transmissive area.

The passivation layer 165 and the first planarization layer 171 are formed to be provided with a third contact hole CH3 in the active area AA, whereby the source electrode 150 is externally exposed through the third contact hole CH3.

Figure 5C:
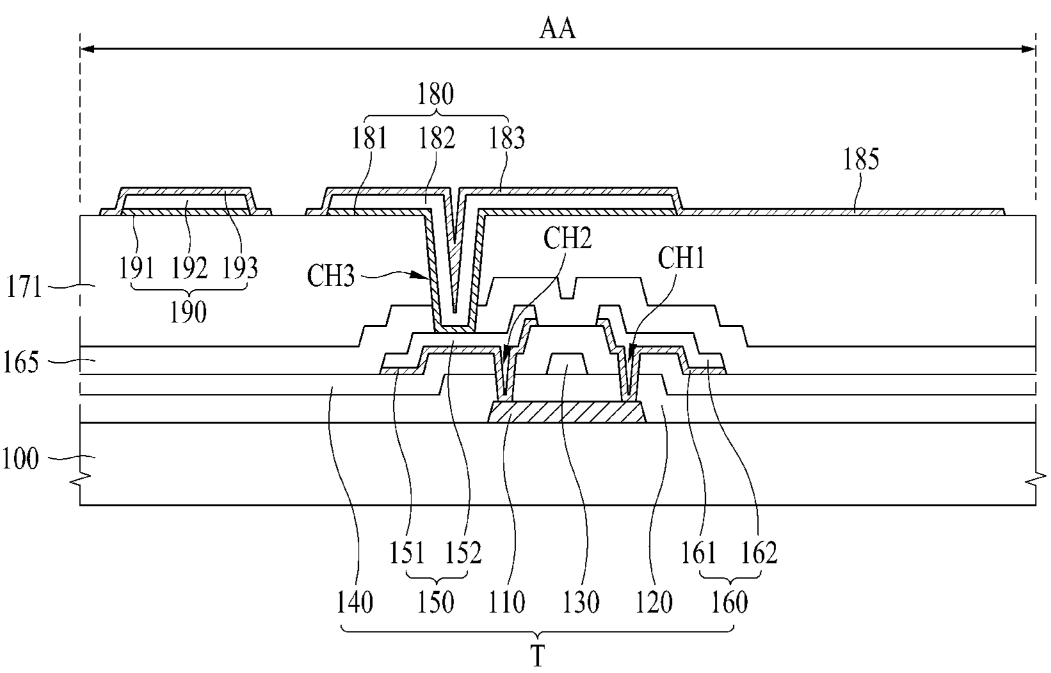

Next, as illustrated in FIG. 5C, a first anode electrode 180 and a first auxiliary electrode 190 are formed to be spaced apart from each other on the first planarization layer 171 within the active area AA, and a connection electrode 185 is formed to be connected with the first anode electrode 180.

The first anode electrode 180 is formed to be connected with the source electrode 150 through the third contact hole CH3. The first anode electrode 180 includes a first lower anode electrode 181, a first upper anode electrode 182, and a first cover anode electrode 183, and the first auxiliary electrode 190 includes a first lower auxiliary electrode 191, a first lower auxiliary electrode 192, and a first cover auxiliary electrode 193.

Particularly, although the first anode electrode 180 and the first auxiliary electrode 190 are formed in the light emitting area to obtain transmittance of a pixel in one embodiment of the present invention, the connection electrode 185 may be connected with the first cover anode electrode 183 and formed in the transmissive area, as illustrated in FIG. 5C.

Figure 5D:
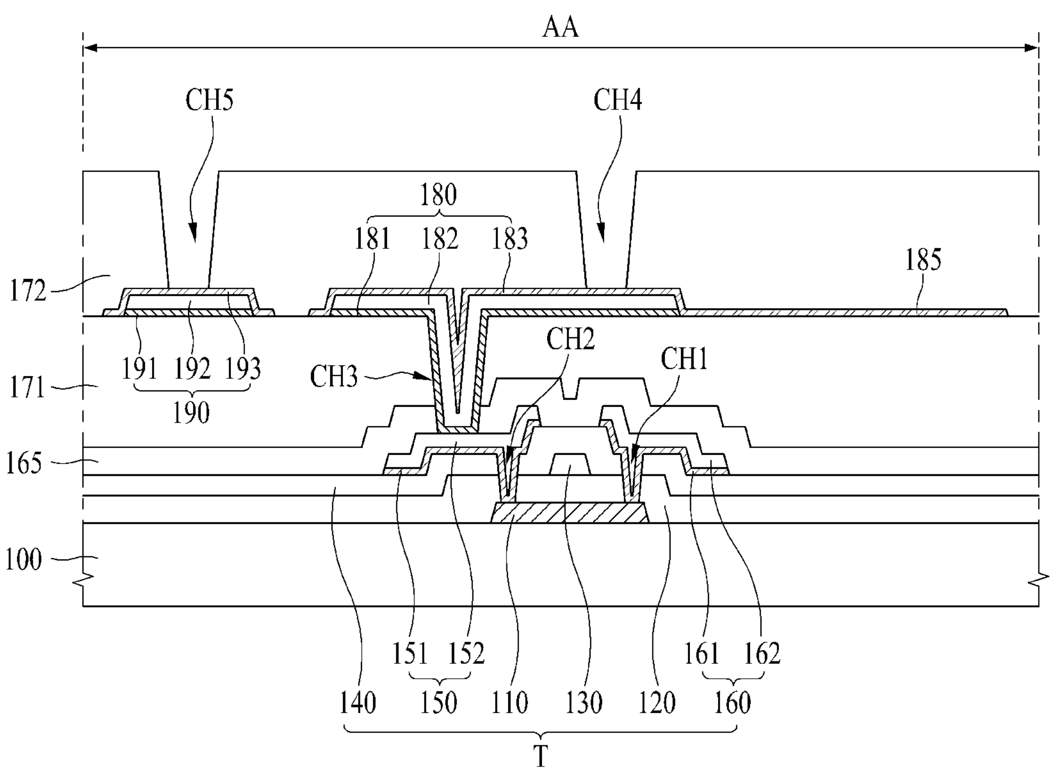
Figure 5E:
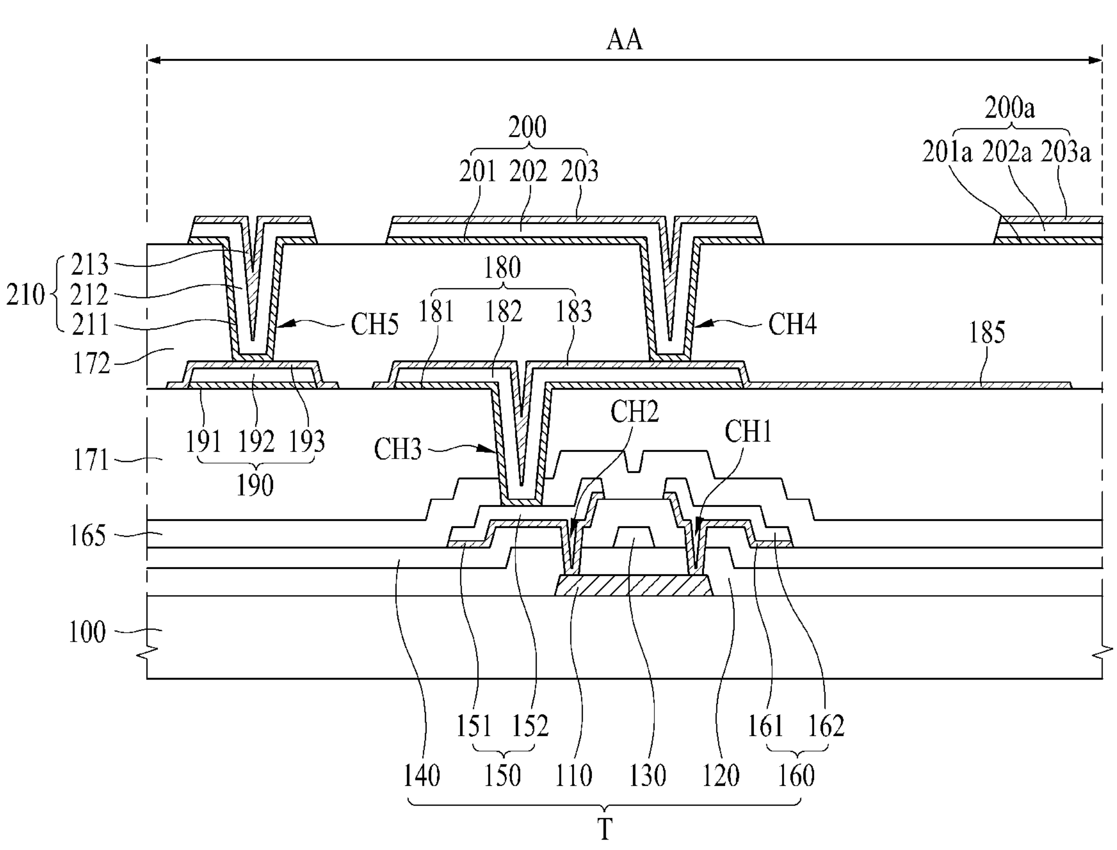

In one embodiment of the present invention, when a defect of a second anode electrode 200 formed through FIG. 5E is tested through an array test for an organic light emitting display device, a test signal applied to the second anode electrode 200 is recognized through the connection electrode 185 formed in the transmissive area. Thus, interference caused by signals of the thin film transistor T and the first anode electrode 180, which are formed below the second anode electrode 200, may be removed, and defect test for the second anode electrode 200 may be performed. Also, since the connection electrode 185 may be made of a transparent conductive material such as ITO, the connection electrode 185 may not affect transmittance of a pixel.

Since the connection electrode 185 may be formed through the same process as that of the first cover anode electrode 183 and the first cover auxiliary electrode 183 simultaneously with them, a separate mask process may not be required.

Next, as illustrated in FIG. 5D, a second planarization layer 172 is formed on the first anode electrode 180, the first auxiliary electrode 190 and the connection electrode 185, which are formed within the active area AA.

The second planarization layer 172 is formed to be provided with a fourth contact hole CH4 and a fifth contact hole CH5, whereby the first anode electrode 180 is externally exposed through the fourth contact hole CH4, and the first auxiliary electrode 190 is externally exposed through the fifth contact hole CH5.

Next, as illustrated in FIG. 5E, a second anode electrode 200 and a second auxiliary electrode 210 are formed to be spaced apart from each other on the second planarization layer 172.

The second anode electrode 200 includes a second lower anode electrode 201, a second center anode electrode 202, and a second upper anode electrode 203, and the second auxiliary electrode 210 includes a second lower auxiliary electrode 211, a second center auxiliary electrode 212, and a second upper auxiliary electrode 213.

The second anode electrode 200 and the second auxiliary electrode 210 may be formed of the same material through the same patterning process at the same time.

Particularly, in one embodiment of the present invention, as illustrated in FIG. 5E, the connection electrode 185 is formed to overlap a second anode electrode 200*a* of a corresponding one of sub pixels of another adjacent pixel. Therefore, if a defect occurs in the second anode electrode 200 of a specific sub pixel, the connection electrode 185 of the specific sub pixel and the second anode electrode 200*a* of another adjacent pixel are welded by a laser to simply repair the defective pixel.

Figure 5F:
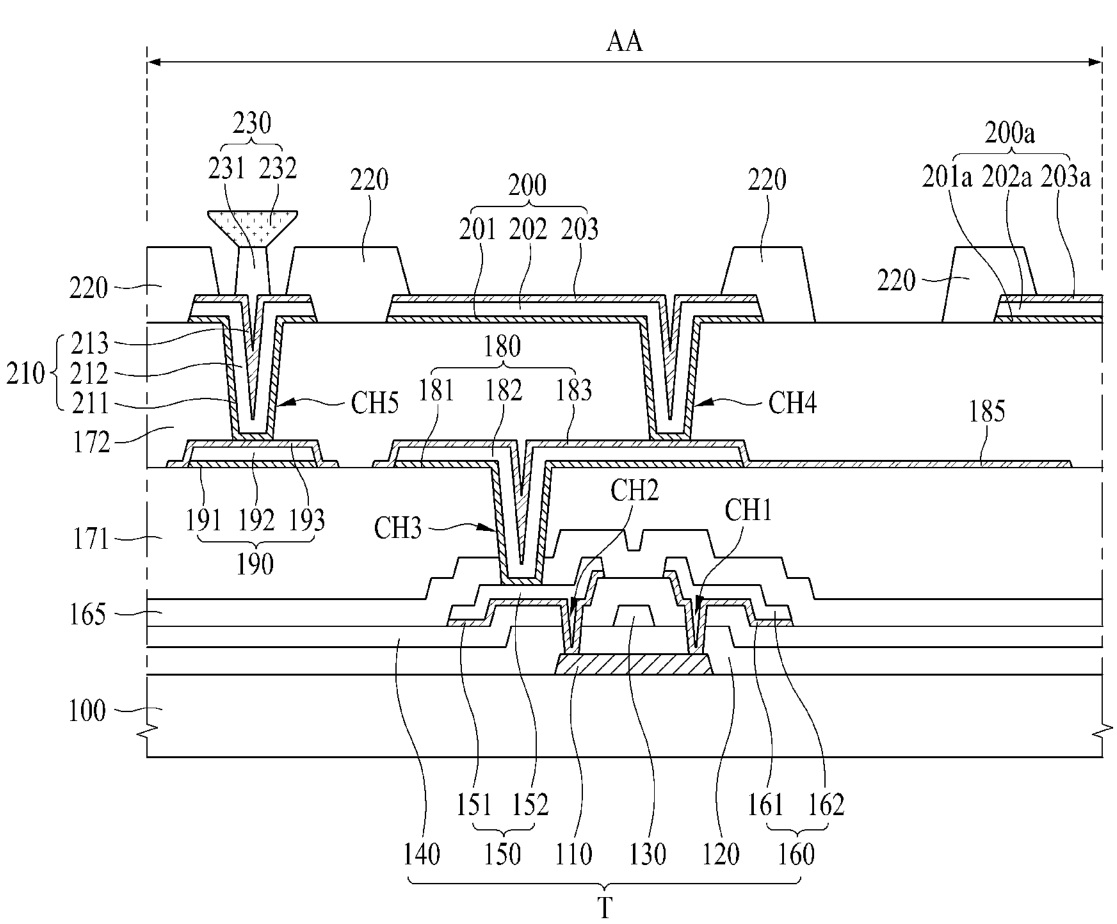

Next, as illustrated in FIG. 5F, a bank 220 is formed on one side and the other side of the second anode electrode 200 while an upper surface of the second anode electrode 200 is being exposed. Also, the bank 220 is formed on one side and the other side of the second auxiliary electrode 210 while the upper surface of the second auxiliary electrode 210 is being exposed.

Also, a first partition wall 231 and a second partition wall 232 are sequentially formed on the exposed second auxiliary electrode 210. The first partition wall 231 may be formed of the same material as that of the bank 220 through the same patterning process as that of the bank 220 simultaneously with the bank 220. The partition wall 230 is formed to be spaced apart from the bank 220 at a predetermined distance, whereby a spaced area is provided between the partition wall 230 and the bank 220.

In order that an upper surface of the partition wall 230 serves as eaves, a width of an upper surface of the second partition wall 232 is formed to be greater than that of a lower surface of the second partition wall 232. Particularly, based on a front surface, the upper surface of the second partition wall 232 covers the spaced area between the partition wall 230 and the bank 220, whereby an organic light emitting layer 240, which will be described later, can be reduced or prevented from being deposited on the spaced area between the partition wall 230 and the bank 220 during a deposition process of the organic light emitting layer 240.

Figure 5G:
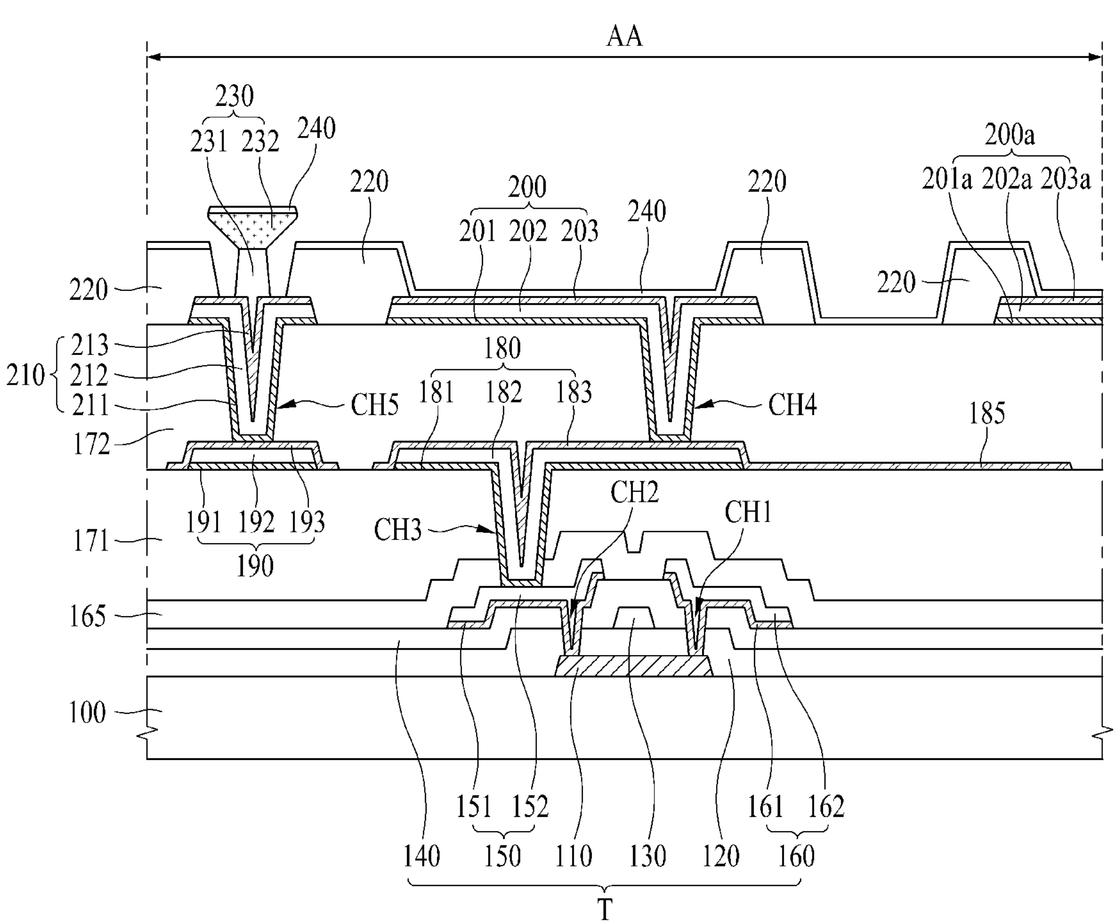

Next, as illustrated in FIG. 5G, the organic light emitting layer 240 is formed on the second anode electrode 200. The organic light emitting layer 240 is formed through a deposition process such as evaporation in which linearity of a deposition material is excellent, whereby the organic light emitting layer 240 may be deposited on the bank 220 and the partition wall 230 but is not deposited on the spaced area between the partition wall 230 and the bank 220. That is, since the upper surface of the partition wall 230 serves as eaves during deposition of the organic light emitting layer 240, even though the organic light emitting layer 240 may be deposited without a mask pattern that covers the upper surface of the second auxiliary electrode 210, the organic light emitting layer 240 may be reduced or prevented from being deposited on the spaced area between the partition wall 230 and the bank 220.

Figure 5H:
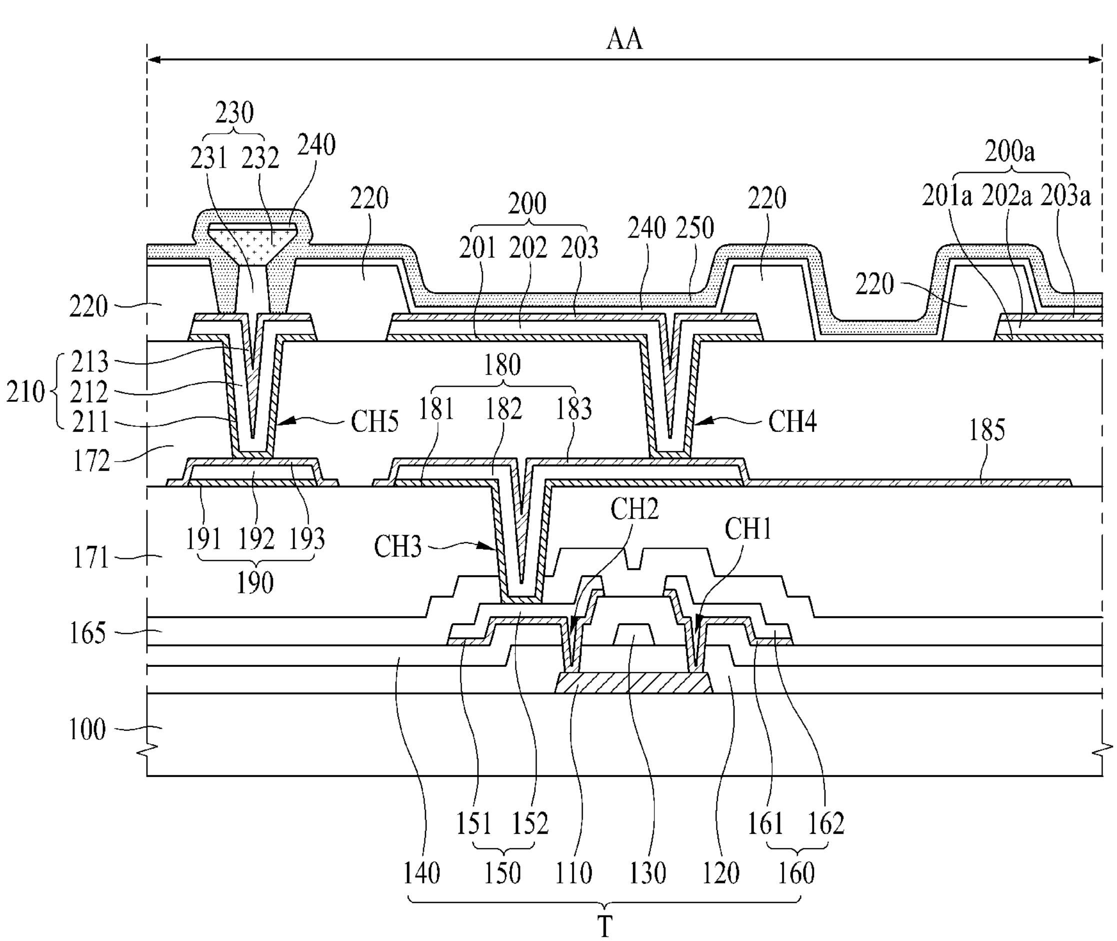

Next, as illustrated in FIG. 5H, a cathode electrode 250 is formed on the organic light emitting layer 240.

The cathode electrode 250 is formed to be connected with the second auxiliary electrode 210 through the spaced area between the partition wall 230 and the bank 220. The cathode electrode 250 may be formed through a deposition process such as sputtering in which linearity of a deposition material is not good, whereby the cathode electrode 250 may be deposited on the spaced area between the partition wall 230 and the bank 220.

According to one embodiment of the present invention, the test signal at the anode electrode is transmitted through the connection electrode connected with the anode electrode and formed in the transmissive area of the pixel, whereby the defect of the anode electrode may be accurately tested substantially without interference caused by another electrode.

According to one embodiment of the present invention, the connection electrode made of a transparent conductive material is formed in the transmissive area of the pixel, whereby the defect of the anode electrode may be tested substantially without affecting transmittance of each pixel.

According to one embodiment of the present invention, since the connection electrode may be formed through a process of forming the anode electrode simultaneously with the anode electrode, the number of mask process may not increase.

According to one embodiment of the present invention, when a defect occurs in an anode electrode of a specific pixel, another anode electrode of a corresponding one of sub pixels of another adjacent pixel and the connection electrode are welded to simply repair the defective pixel.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:

a substrate including a plurality of pixels, each of the plurality of pixels comprising a light emitting area including a plurality of sub pixels and a non-light emitting area including a transmissive area;

an anode electrode in the light emitting area;

an organic light emitting layer on the anode electrode;

a cathode electrode on the organic light emitting layer; and a connection electrode connected with the anode electrode, the connection electrode provided in the non-light emitting area, wherein the connection electrode extends along one side of the transmissive area and comprises a transparent conductive material.

2. The organic light emitting display device of claim 1, wherein the connection electrode overlaps an adjacent anode electrode of a corresponding one of the plurality of sub pixels.

3. The organic light emitting display device of claim 1, wherein the cathode electrode is in the light emitting area, the transmissive area, and an area between transmissive areas.

4. The organic light emitting display device of claim 2, wherein the anode electrode includes a first anode electrode and a second anode electrode, and the connection electrode is on a same layer as the first anode electrode.

5. The organic light emitting display device of claim 4, wherein the second anode electrode is connected with the first anode electrode through a contact hole.

6. The organic light emitting display device of claim 4, wherein, when the anode electrode of a specific sub pixel from the plurality of sub pixels has a defect, the connection electrode of the specific sub pixel and an adjacent anode electrode of the corresponding one of sub pixels are welded by a laser.

7. The organic light emitting display device of claim 1, further comprising:

an auxiliary electrode connected with the cathode electrode.

8. The organic light emitting display device of claim 7, wherein the auxiliary electrode is in the light emitting area.

9. The organic light emitting display device of claim 7, wherein the auxiliary electrode is overlapped with the anode electrode.

10. The organic light emitting display device of claim 7, wherein the auxiliary electrode includes a lower auxiliary electrode, an upper auxiliary electrode, and a cover auxiliary electrode.

11. The organic light emitting display device of claim 10, wherein the cover auxiliary electrode covers an upper surface and a side of the upper auxiliary electrode.

12. The organic light emitting display device of claim 7, wherein a width of the auxiliary electrode is greater than a width of the anode electrode.

13. The organic light emitting display device of claim 1, wherein the plurality of sub pixels is comprised of sub pixels that emit red light, white light, blue light, and green light, and the sub pixels are arranged in a first direction.

14. The organic light emitting display device of claim 2, wherein the corresponding one of the plurality of sub pixels is a sub pixel that emits the same light.

15. The organic light emitting display device of claim 1, wherein the light emitting area and the transmissive area have different areas.

16. The organic light emitting display device of claim 1, wherein the transmissive area has an area that is larger than an area of the light emitting area.

17. The organic light emitting display device of claim 1, wherein a width of the cathode electrode is greater than a width of the connection electrode.

* * * * *